(12) United States Patent
Iwamoto et al.

(10) Patent No.: US 7,579,927 B2
(45) Date of Patent: Aug. 25, 2009

(54) DUPLEXER

(75) Inventors: Yasuhide Iwamoto, Kawasaki (JP); Shogo Inoue, Kawasaki (JP); Masanori Ueda, Yokohama (JP)

(73) Assignees: Fujitsu Media Devices Limited, Yokohama (JP); Fujitsu Limited, Kawasaki (JP)

( * ) Notice: Subject to any disclaimer, the term of this patent is extended or adjusted under 35 U.S.C. 154(b) by 0 days.

(21) Appl. No.: 11/291,775

(22) Filed: Dec. 2, 2005

(65) Prior Publication Data

US 2006/0132260 A1   Jun. 22, 2006

(30) Foreign Application Priority Data

Dec. 22, 2004   (JP) ............................. 2004-371079

(51) Int. Cl.
*H03H 9/72* (2006.01)

(52) U.S. Cl. ........................ 333/133; 333/193

(58) Field of Classification Search ................ 333/133, 333/187, 193, 132
See application file for complete search history.

(56) References Cited

U.S. PATENT DOCUMENTS

| | | | |
|---|---|---|---|
| 6,462,631 B2 * | 10/2002 | Bradley et al. | 333/189 |
| 6,566,981 B2 * | 5/2003 | Urabe et al. | 333/193 |
| 6,714,098 B2 * | 3/2004 | Nishida et al. | 333/133 |
| 6,822,537 B1 * | 11/2004 | Taniguchi et al. | 333/194 |
| 6,919,778 B2 | 7/2005 | Iwamoto et al. | |
| 2003/0098757 A1 * | 5/2003 | Iwamoto et al. | 333/133 |
| 2005/0146397 A1 * | 7/2005 | Koga et al. | 333/133 |
| 2006/0197630 A1 * | 9/2006 | Fuse | 333/133 |

FOREIGN PATENT DOCUMENTS

| | | | |
|---|---|---|---|
| CN | 1421999 A | | 6/2003 |
| JP | 09-098046 A | | 4/1997 |
| JP | 11186872 A | * | 7/1999 |
| JP | 2001-313542 A | | 11/2001 |
| JP | 2004080233 | | 3/2004 |
| JP | 2004-328676 A | | 11/2004 |
| KR | 2002-0041518 A | | 6/2002 |

* cited by examiner

*Primary Examiner*—Benny Lee
*Assistant Examiner*—Alan Wong
(74) *Attorney, Agent, or Firm*—Arent Fox LLP.

(57) ABSTRACT

A duplexer includes: a transmission filter and a reception filter that have different band center frequencies from each other; a phase matching circuit that performs phase matching on the transmission filter and the reception filter; and a laminated package that includes a first layer on which the transmission filter, the reception filter, and the phase matching circuit are mounted. In this duplexer, the first layer includes a first ground line pattern that is connected to a ground of the transmission filter, a second ground line pattern that is connected to a ground of the reception filter, a third ground line pattern that is connected to a ground of the phase matching circuit, and signal line patterns. The laminated package also includes a second layer that is located below the first layer. The second layer includes a partition ground line pattern that is located between the signal line patterns, a signal foot pad for external connection, and a ground foot pad. The first ground line pattern and the second ground line pattern are connected to the partition ground line pattern via the ground foot pad.

6 Claims, 17 Drawing Sheets

CAP MOUNTING
LAYER 121

CAVITY
LAYER 122

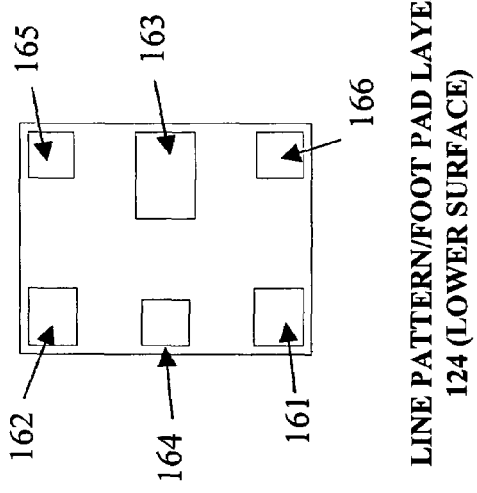
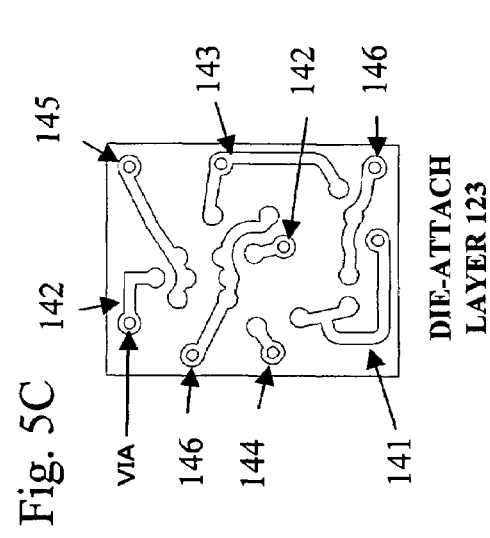
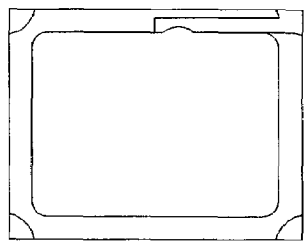
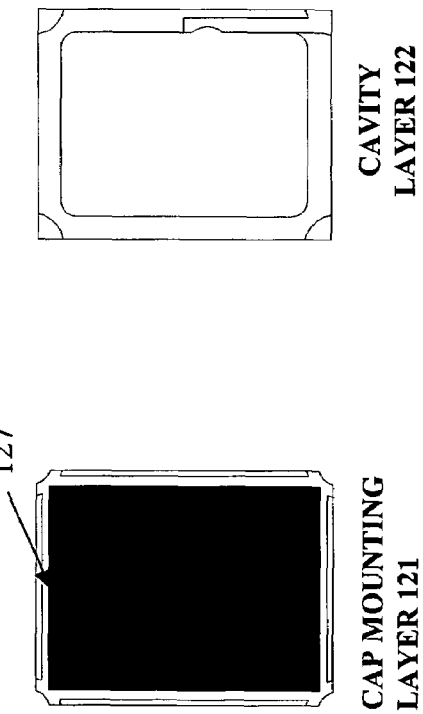
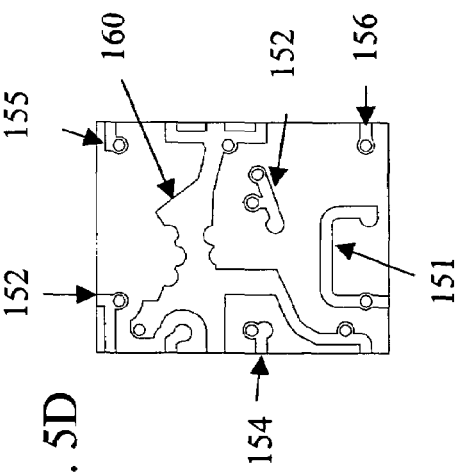

DUPLEXER

BACKGROUND OF THE INVENTION

1. Field of the invention

The present invention generally relates to duplexers, and more particularly, to a duplexer that employs an acoustic wave device such as a surface acoustic wave device or a piezoelectric thin-film device.

2. Description of the Related Art

In recent years, as the mobile communication systems have developed, mobile phone handsets and mobile information terminals have rapidly spread, and the manufacturers are still competing against each other for smaller terminals with higher performance. Also, there are both analog and digital systems for mobile telephone communication, and the frequencies used in the motile communication systems range from the 800 MHz to 1 GHz band to the 1.5 GHz to 2.0 GHz. Antenna duplexer devices that employ surface acoustic wave filters have been suggested as the devices for the mobile communication.

In the recent development of mobile phone handsets, the functions of the terminals have been improved with the "dual mode" (the combination of analog and digital systems, and the combination of digital TDMA (time division multiple access) and CDMA (code division multiple access)) or the "dual band" (the combination of the 800 MHz band and the 1.9 GHz band, or the combination of the 900 MHz and the 1.8 GHz or the 1.5 GHz), as the variety of systems has become wider. The components (filters) for those mobile communication systems have also been improved for higher performance.

Meanwhile, other than the functions with higher performance, there is a demand for smaller devise and lower production costs. Each of the antenna duplexers in high-performance terminals is often formed with dielectrics or complex duplexers of surface acoustic wave filters having at least one dielectric, or only with a surface acoustic wave device.

With dielectric duplexers, it is difficult to obtain a smaller or thinner mobile terminal, because of the large size of each dielectric duplexer. Even in a case where a surface acoustic wave device is employed, the size of a dielectric device makes it difficult to obtain a smaller or thinner mobile terminal. Among conventional duplexer devices that employ surface acoustic wave filters, there are module-type devices each having a transmission filter, a reception filter, and a matching circuit mounted separately on a printed board, and integrated-type devices each having transmission and reception filter chips mounted in a multi-layer ceramic package and a matching circuit provided in a package. The volume of each of those devices ⅓ to 1/15 of the volume of a dielectric duplexer, and the height is ½ to ⅓ of the height of a dielectric duplexer. Thus, smaller and thinner duplexer devices can be obtained.

Next, a conventional duplexer is described. FIG. 1 is a block diagram illustrating the structure of the conventional duplexer. FIG. 2 shows the frequency characteristics of the duplexer. In the graph of FIG. 2, the abscissa axis indicates the frequency (which becomes higher toward the right), and the ordinate axis indicates the pass intensity (which becomes higher toward the top). As shown in FIG. 1, the duplexer 10 includes two filters 12 and 13, a phase matching circuit 11, a common terminal 14, and individual terminals 15 and 16. The common terminal 14 connects an external terminal for transmitting and receiving electric waves through an antenna. The transmission terminal 15 is connected to an external transmission circuit, and signals with desired center frequencies are input through the transmission terminal 15. The reception terminal is connected to an external reception circuit, and signals with desired center frequencies are output through the reception terminal 16. The transmission terminal 15, the reception terminal 16, and another terminal are grounded to a ground level (GND).

Normally, the surface acoustic wave filters 12 and 13 and the phase matching circuit 11 are housed in a multi-layer ceramic package. The filters 12 and 13 are surface acoustic wave filters, and have passband center frequencies F1 and F2 that are different from each other (F2>F1). For example, the filter 12 is a filter for transmission, and the filter 13 is a filter for reception (hereinafter, the filters 12 and 13 will also be referred to as the transmission filter and the reception filter). In a duplexer of the 1.9 GHz band, for example, the frequency difference between F1 and F2 is approximately 100 MHz.

The phase matching circuit 11 is provided so as to prevent the filters 12 and 13 from degrading the filter characteristics of each other. Here, the characteristic impedance in the case where the filter 12 is seen from the common terminal is denoted by Z1, and the characteristic impedance in the case where the filter 13 is seen from the common terminal 14 is denoted by Z2. By virtue of the phase matching circuit 11, in a case where the frequency of a signal to be input through the common terminal 14 is F1, the characteristic impedance Z1 on the side of the filter 12 is the same as the characteristic impedance value of the common terminal 14, and the characteristic impedance on the side of the filter 13 is infinite, with the coefficient of reflection being 1. In a case where the frequency of a signal is F2, the characteristic impedance on the side of the filter 12 is infinite, with the coefficient of reflection being 1, and the characteristic impedance Z2 of the filter 13 is the same as the characteristic impedance of the common terminal 14.

Next, the prior arts suggested for smaller devices are described. Japanese Unexamined Patent Publication No. 2004-328676 discloses a duplexer in which the chips of surface acoustic wave filters are face-down mounted to the die-attach layer of the package, and the line pattern for phase matching are pulled over two layers. Japanese Patent No. 3487692 (Japanese Unexamined Patent Publication No. 9-98046) discloses a surface acoustic wave duplexer that has lumped-constant inductors and capacitors in a phase matching circuit.

In Japanese Unexamined Patent Publication No. 2004-328676, however, the package size is as large as 5 mm in side, and 1.5 mm in height, because the line patterns for phase matching are pulled over two layers. Accordingly, the duplexer disclosed in Japanese Unexamined Patent Publication No. 2004-328676 has the drawback of being tall. Also, since a large-area ground pattern (a mat ground) is disposed immediately below the signal lines, the stray capacitance of the signal lines increases, resulting in poorer impedance matching. As the impedance matching deteriorates, the insertion loss increases.

Also, in Japanese Patent No. 3487692, the duplexer is designed to be smaller than a device using dielectric filters. Therefore, the estimated device size is 8×5.1×2.5 mm. Furthermore, Japanese Patent No. 3487692 does not concern the technique of mounting chips in a package, especially the technique of obtaining higher isolation between signals and adjusting the inductance of the ground for parallel-arm resonators.

SUMMARY OF THE INVENTION

It is therefore an object of the present invention to provide a duplexer in which the above disadvantage is eliminated.

A more specific object of the present invention is to provide a duplexer that can maintain high isolation between signals and stable characteristics, though it has a small device size.

According to an aspect of the present invention, there is provided a duplexer comprising: a transmission filter and a reception filter that have different band center frequencies from each other; a phase matching circuit that performs phase matching on the transmission filter and the reception filter; and a laminated package that includes a first layer on which the transmission filter, the reception filter, and the phase matching circuit are mounted, the first layer comprising a first ground line pattern that is connected to a ground of the transmission filter, a second ground line pattern that is connected to a ground of the reception filter, a third ground line pattern that is connected to a ground of the phase matching circuit, and a plurality of signal line patterns, the laminated package also comprising a second layer that is located below the first layer, the second layer comprising a partition ground line pattern that is located between the signal line patterns, a signal foot pad for external connection, and a ground foot pad, the first ground line pattern and the second ground line pattern being connected to the partition ground line pattern via the ground foot pad.

According to another aspect of the present invention, there is provided a duplexer comprising: a transmission filter and a reception filter that have different band center frequencies from each other; a phase matching circuit that performs phase matching on the transmission filter and the reception filter; and a laminated package that includes a first layer on which the transmission filter, the reception filter, and the phase matching circuit are mounted, the first layer comprising a first ground line pattern that is connected to a ground of the transmission filter, and a second ground line pattern that is connected to a ground of the reception filter, the first ground line pattern and the second ground line pattern being arranged so that the direction of current flowing through the first ground line pattern is substantially opposite to the direction of current flowing through the second ground line pattern.

Thus, the present invention can provide a duplexer that can maintain high isolation between signals and stable characteristics, though it has a small device size. The present invention can also provide an electronic device that employs the duplexer.

BRIEF DESCRIPTION OF THE DRAWINGS

Other objects, features and advantages of the present invention will become more apparent from the following detailed description when read in conjunction with the accompanying drawings, in which:

FIGS. 5A through 5E illustrate the layers that constitute the laminated package of the duplexer in accordance with the first embodiment;

DESCRIPTION OF THE PREFERRED EMBODIMENTS

The following is a detailed description of embodiments of the present invention, with reference to the accompanying drawings.

First Embodiment

Figure 1:
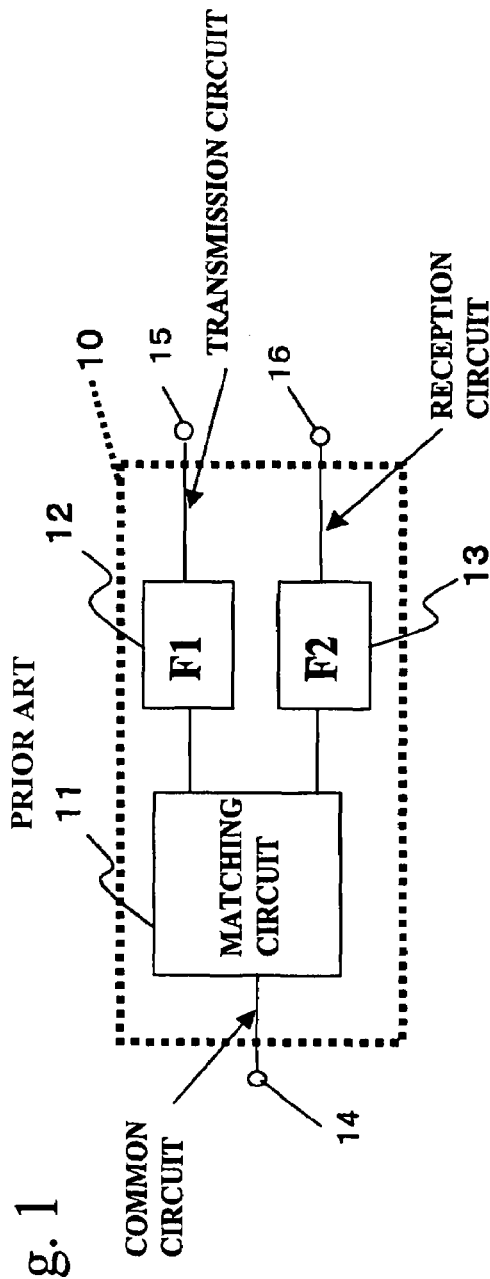
FIG. 1 is a block diagram illustrating the structure of a conventional duplexer.
Figure 2:
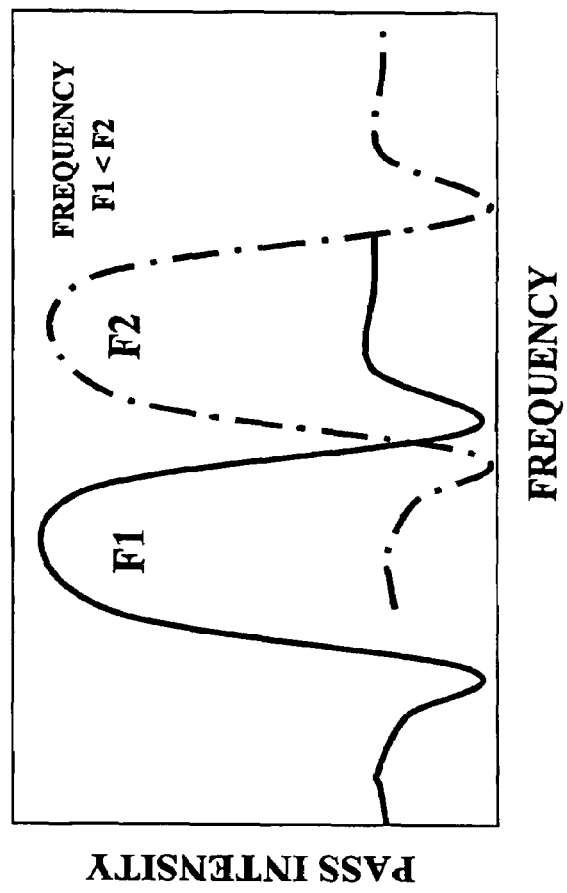
FIG. 2 shows the frequency characteristics of the duplexer shown in FIG. 1.
Figure 3:
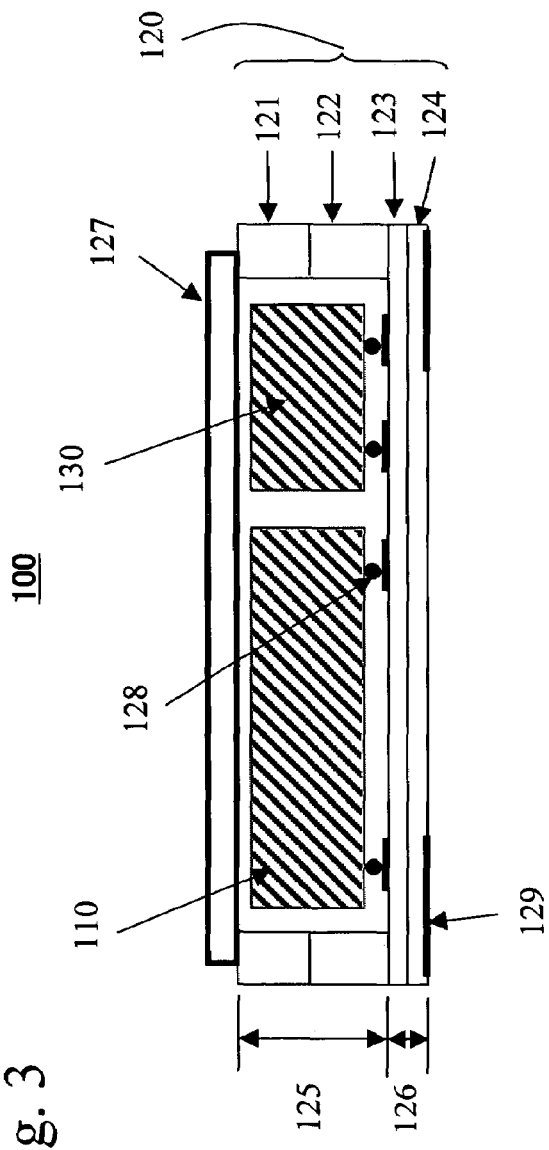
FIG. 3 is a cross-sectional view of a duplexer in accordance with a first embodiment of the present invention.

FIG. 3 is a cross-sectional view of a duplexer in accordance with a first embodiment of the present invention. The duplexer 100 includes a filter chip 110, a phase matching circuit 130, and a laminated package 120. The duplexer 100 embodies the circuit structure illustrated in FIG. 1. The laminated package 120 has ceramics layers 121 through 124 stacked on one another. The layers 121 through 124 include a cap mounting layer 121, a cavity 122, a die-attach layer 123, and a line pattern/foot pad layer 124. The cap mounting layer 121 and the cavity layer 122 constitute a cavity forming layer 125 for forming a cavity in the laminated package 120. The die-attach layer 123 and the line pattern/foot pad layer 124 constitute a base layer 126 of the laminated package 120. The filter chip 110 and the phase matching circuit 130 in the cavity are face-down bonded to the die-attach face of the die-attach layer 123 with bumps 128. A circuit pattern that will be described later is also formed on the die-attach face. Another circuit pattern that will also be described later is formed on the upper surface of the line pattern/foot pad layer 124, and foot pads 129 are formed on the lower layer (which is the bottom face of the laminated package 120). The cavity of the laminated package 120 is sealed with a cap 127. The die-attach layer 123 and the line pattern/foot pad layer 124 are defined as a first layer and a second layer.

Figure 4:
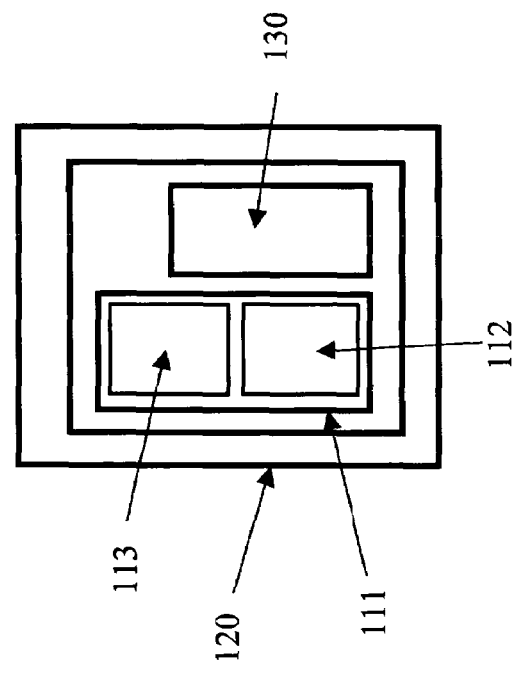
FIG. 4 is a plan view of the duplexer in accordance with the first embodiment, with the cap being removed.

FIG. 4 is a plan view of the duplexer 100, with the cap 127 being removed. The phase matching circuit 130 is a chip-like component, and is adjacent to the filter chip 110. The filter chip 110 is formed with a single chip or includes a transmission filter 112 and a reception filter 113 that are formed on an independent piezoelectric substrate 111.

FIGS. 5A through 5E illustrate the layers of the laminated package 120. FIG. 5A shows the cap mounting layer 121. FIG. 5B shows the cavity layer 122. FIG. 5C shows the die-attach layer 123. FIGS. 5D and 5E shows the upper surface and the lower surface of the line pattern/foot pad layer 124.

Figure 6:
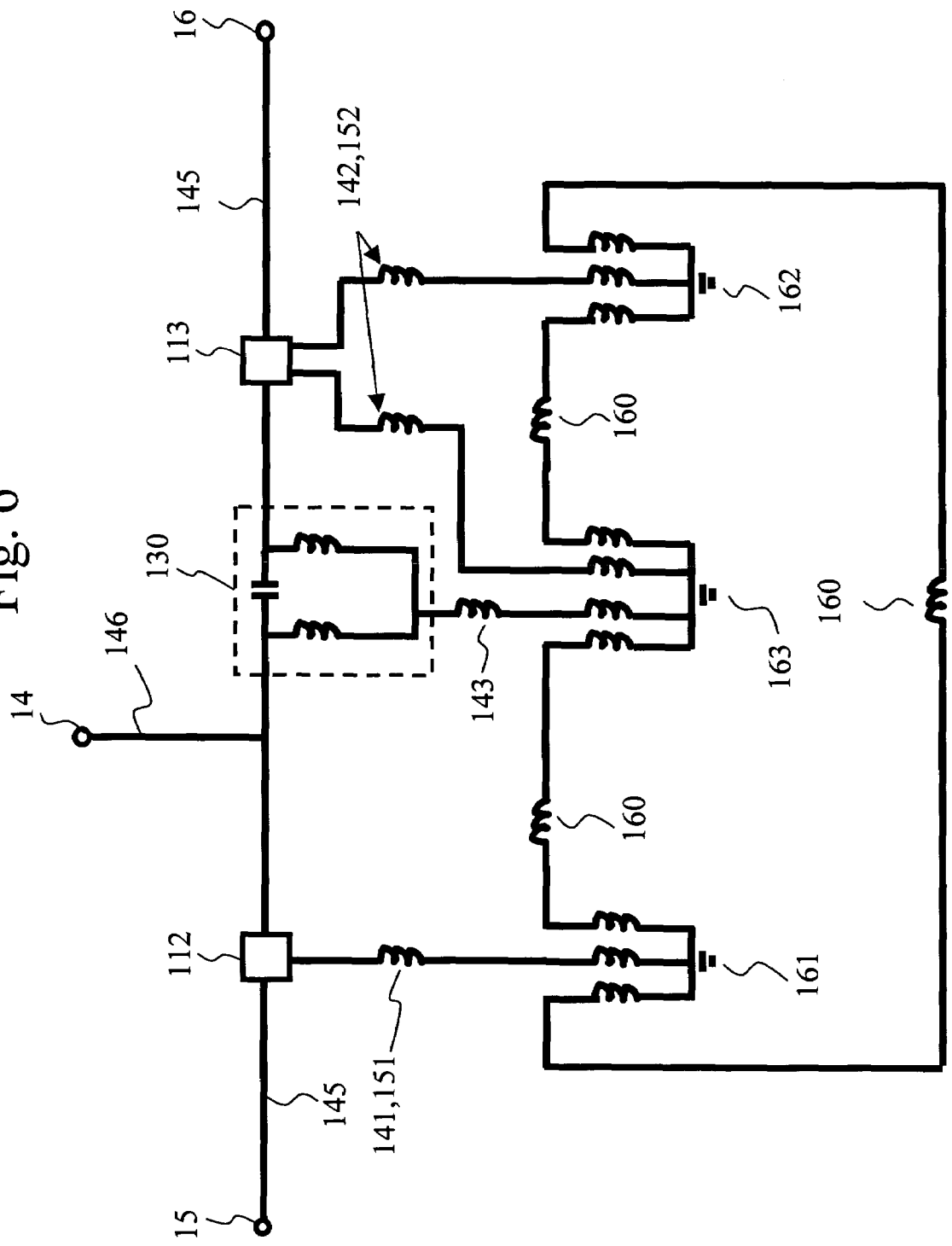
FIG. 6 is a circuit diagram of the duplexer in accordance with the first embodiment.

As shown in FIG. 5C, the die-attach layer 123 includes a transmission ground line pattern 141, a reception ground line pattern 142, a phase matching circuit ground line pattern 143, a transmission signal line pattern 144, a reception signal line pattern 145, and a common terminal signal line pattern 146. These line patterns form the circuit illustrated in FIG. 6. As shown in FIG. 6, each line pattern contains an inductance component. The small circles shown in FIGS. 5C and 5D are vias for electrically connecting layers.

As shown in FIG. 5D, a transmission ground line pattern 151, a reception ground line pattern 152, a transmission signal line pattern 154, a reception signal line pattern 155, a common terminal signal line pattern 156, and a partition ground line pattern 160 are formed on the upper surface of the line pattern/foot pad layer 124. As shown in FIG. 5E, ground foot pads 161 through 163, a transmission foot pad 164, a reception foot pad 165, and a common terminal foot pad 166 are formed on the lower surface of the line pattern/foot pad layer 124. These foot pads are collectively denoted by reference numeral 129 in FIG. 3. The line patterns and the foot pads shown in FIGS. 5D and 5E form the circuit illustrated in FIG. 6. The partition ground line pattern 160 is interposed between the signal line patterns. More specifically, the partition ground line pattern 160 is interposed between the common terminal signal line pattern 146 and the reception signal line pattern 145, between the common terminal signal line pattern 146 and the transmission signal line pattern 144, and between the transmission signal line pattern 144 and the reception signal line pattern 145. Likewise, the partition ground line pattern 160 is interposed between the signal line patterns in the line pattern layer shown in FIG. 5D.

Figure 7:
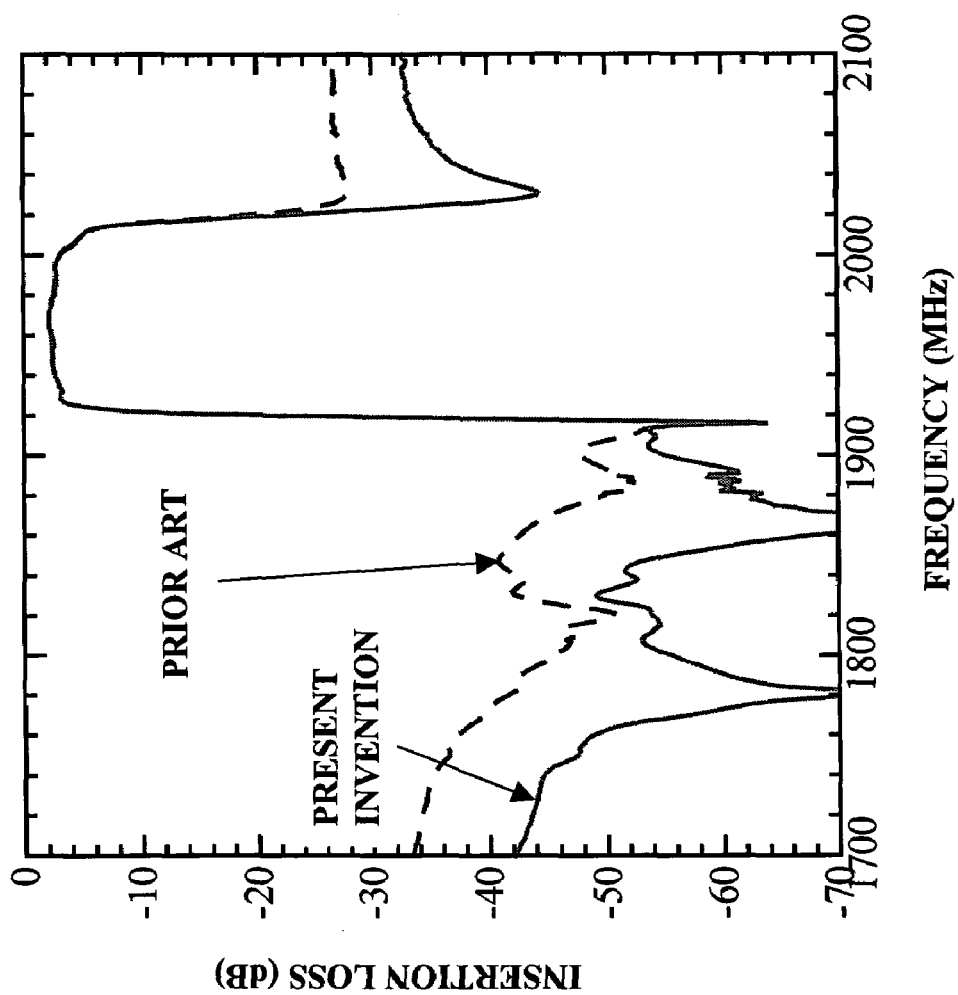
FIG. 7 is a graph showing the frequency characteristics of the reception filter of the duplexer in accordance with the first embodiment and the frequency characteristics of the reception filter of a conventional duplexer without a partition line pattern.

FIG. 7 is a graph showing the frequency characteristics of the reception filter of the duplexer in accordance with the first embodiment and the reception filter of a conventional duplexer without the partition ground line pattern 160. In the graph, the abscissa axis indicates frequency (MHz), and the ordinate axis indicates insertion loss (dB). The solid line indicates the frequency characteristics of the reception filter 113 of the duplexer in accordance with the first embodiment, and the broken line indicates the frequency characteristics of the reception filter of a conventional duplexer. In the first embodiment, the partition ground line pattern 160 is interposed between the reception signal line patterns 145 and 155 and between the common terminal signal line patterns 146 and 156. Accordingly, the bridging capacitance between these line patterns can be reduced, and a smaller duplexer with highly restrained characteristics can be realized. The die-attach layer 123 may be provided with a partition ground line pattern. However, it is necessary to form a large number of line patterns in the die-attach layer 123. Therefore, the size of the die-attach layer 123 needs to be increased so as to accommodate the partition ground line pattern. In the first embodiment, the partition ground line pattern 160 is formed on the upper surface of the line pattern/foot pad layer 124, which is located below the die-attach layer 123. Thus, a smaller duplexer with highly restrained characteristics can be realized.

Figure 8:
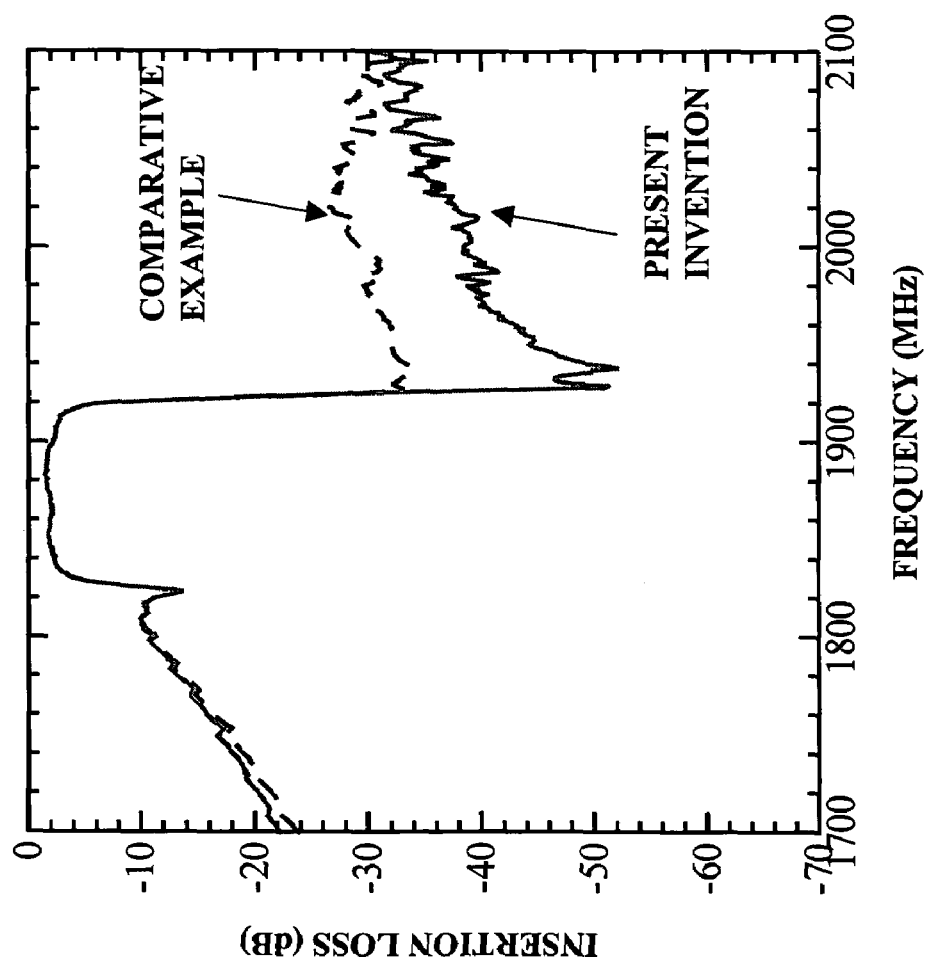
FIG. 8 is a graph showing the frequency characteristics of the transmission filter of the duplexer in accordance with the first embodiment and the frequency characteristics of the transmission filter of a conventional duplexer without a partition line pattern.

FIG. 8 is a graph showing the frequency characteristics of the transmission filter of the duplexer in accordance with the first embodiment and the transmission filter of a conventional duplexer without the partition ground line pattern 160. In the graph, the abscissa axis indicates frequency (MHz), and the ordinate axis indicates insertion loss (dB). The solid line indicates the frequency characteristics of the transmission filter 112 of the duplexer in accordance with the first embodiment, and the broken line indicates the frequency characteristics of the transmission filter of a conventional duplexer. In the first embodiment, the partition ground line pattern 160 is interposed between the transmission signal line patterns 144 and 154 and between the common terminal signal line patterns 146 and 156. Accordingly, the bridging capacitance between these line patterns can be reduced, and a smaller duplexer with highly restrained characteristics can be realized.

The inductance that is necessary for the transmission filter 112 is formed with the transmission ground line patterns 141 and 151 formed in the die-attach layer 123 and the line pattern/foot pad layer 124. Likewise, the inductance that is necessary for the reception filter 113 is formed with the reception ground line patterns 142 and 152 formed in the die-attach layer 123 and the line pattern/foot pad layer 124. The transmission ground line patterns 141 and 151 connect the ground of the transmission filter 112 directly to the ground foot pad 161. Likewise, the reception ground line patterns 142 and 152 connect the ground of the reception filter 113 directly to the ground foot pads 162 and 163. Further, the phase matching circuit ground line pattern 143 connects the ground of the phase matching circuit 130 directly to the ground foot pad 163. The partition ground line pattern 160 connects the ground foot pads 161 through 163 to one another. With this arrangement, necessary ground inductances can be obtained, and can be readily controlled. Furthermore, stable filter characteristics that are hardly affected by external noise can be achieved, regardless of the mounting state of the duplexer.

The partition ground line pattern 160 is interposed between the transmission signal line pattern 154 and the reception foot pad 165 and between the transmission signal line pattern 154 and the common terminal foot pad 166. The partition ground line pattern 160 is also interposed between the reception signal line pattern 155 and the transmission foot pad 164 and between the reception signal line pattern 155 and the common terminal foot pad 166. The partition ground line pattern 160 is also interposed between the common terminal signal line pattern 156 and the transmission foot pad 164 and the common terminal signal line pattern 156 and the reception foot pad 165. The partition ground line pattern 160 is disposed not to overlap with the transmission signal line pattern 144 and the reception signal line pattern 145. With this arrangement, the bridging capacitance between signals can be further reduced, and highly restrained filter characteristics can be realized. This arrangement is effective in a case where the base layer 126 of the laminated package 120 is as thin as 0.1 mm. If the signal line patterns overlap with the partition ground line pattern 160 in the case of such a thin base layer, the stray capacitance of the signal line patterns greatly increases, resulting in poor impedance matching and more insertion loss.

Figure 9:
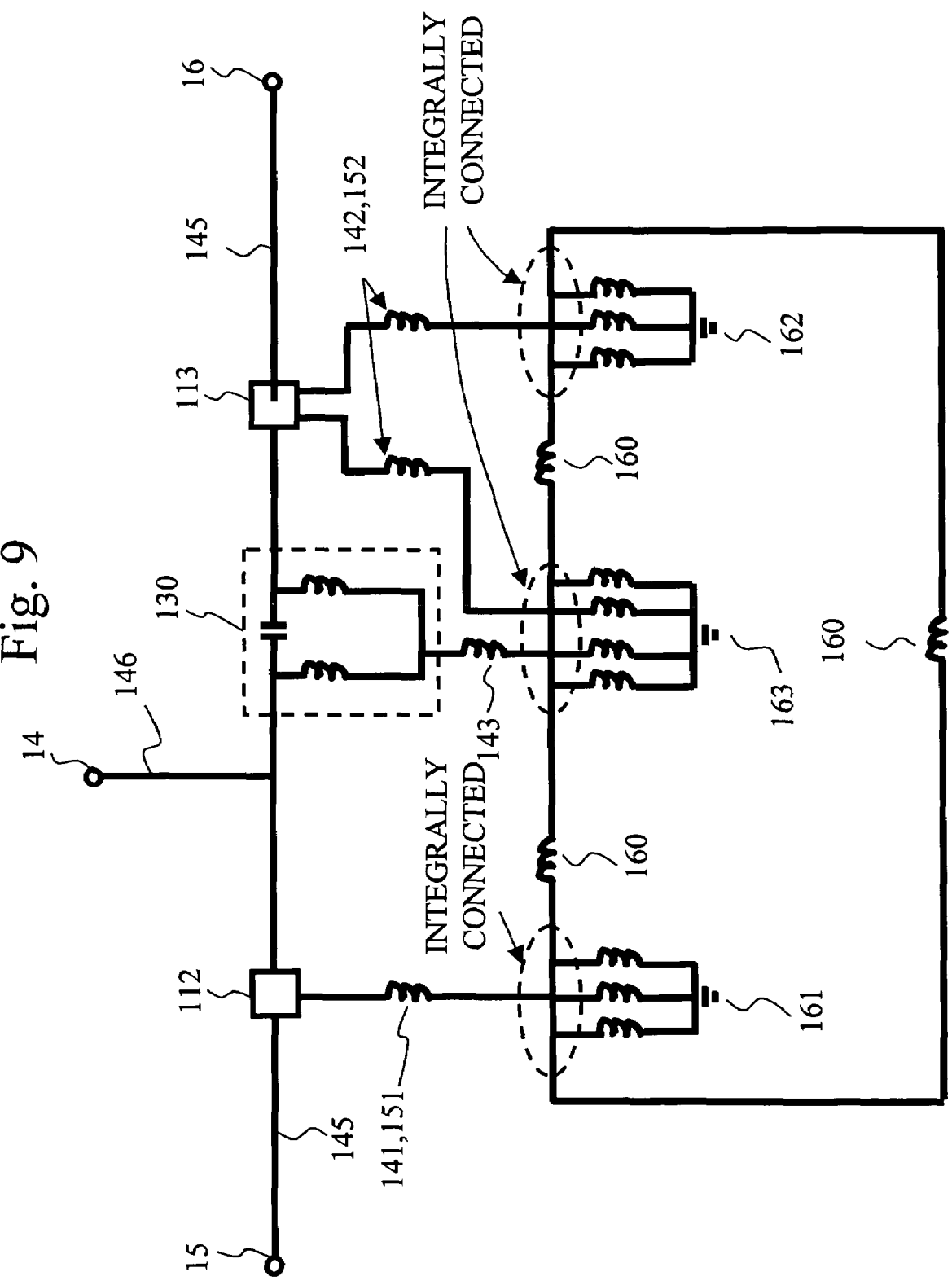
FIG. 9 illustrates the structure of a duplexer as a comparative example.

FIG. 9 illustrates the structure of a duplexer as a comparative example. This comparative example is a modification of the structure of the first embodiment. More specifically, the partition ground line pattern 160 connects the components other than the ground foot pads 161 through 163. For example, on the line pattern layer shown in FIG. 5D, the partition ground line pattern 160 connects or integrates the transmission ground line patterns 141 and 151, the reception ground line patterns 142 and 152, and the phase matching circuit ground pattern 143.

Figure 10:
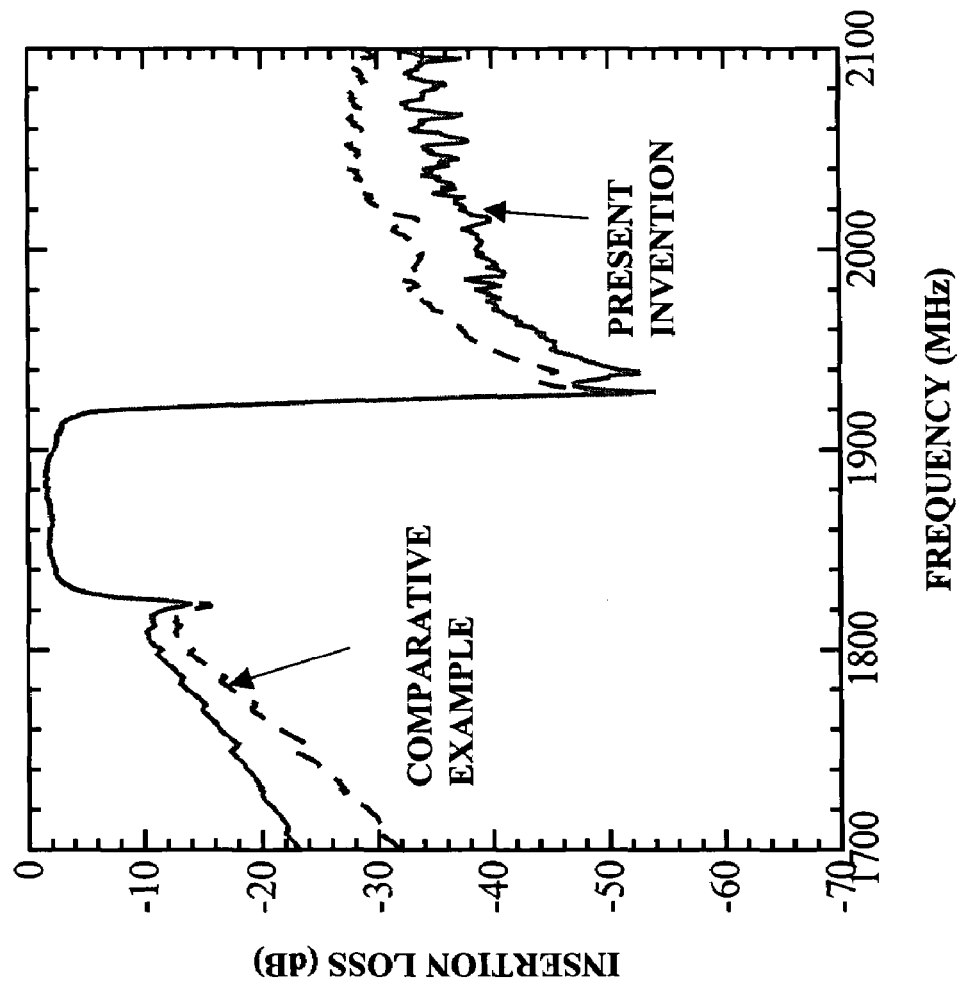
FIG. 10 shows the frequency characteristics of the transmission filters of the comparative example shown in FIG. 9 and the first embodiment.
Figure 11:
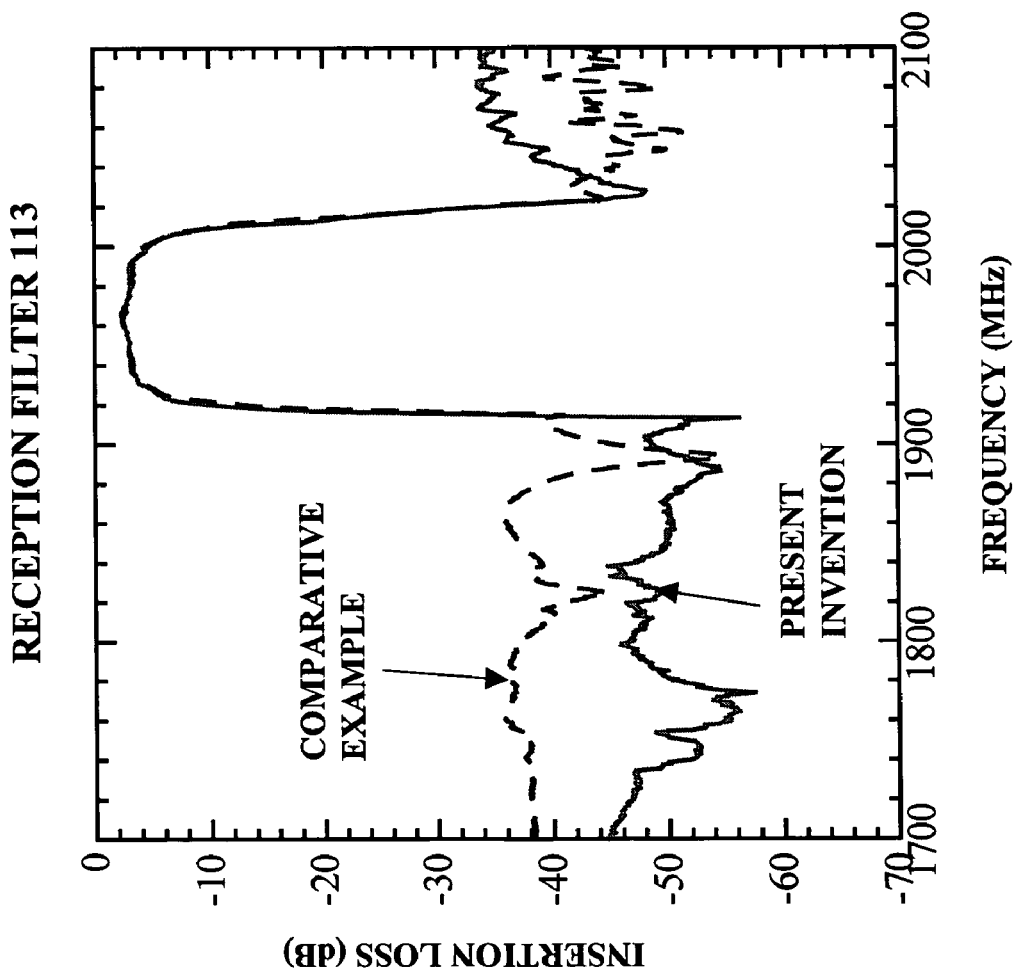
FIG. 11 shows the frequency characteristics of the reception filters of the comparative example shown in FIG. 9 and the first embodiment.

FIG. 10 shows the frequency characteristics of the transmission filters 112 of the comparative example and the first embodiment. FIG. 11 shows the frequency characteristics of the reception filters 113 of the comparative example and the first embodiment. In each of these graphs, the solid line indicates the characteristics of the first embodiment, and the broken line indicates the characteristics of the comparative example. FIG. 10 shows the measurement results that were obtained where the partition ground line pattern 160 was not connected to the reception ground line patterns 142 and 152. FIG. 11 shows the measurement results that were obtained where the partition ground line pattern 160 was not connected to the transmission ground line patterns 141 and 151. In the comparative example, the inductance of the partition ground line pattern 160 is greatly reflected in the characteristics, and the stop-band suppression is poor. On the other hand, the degree of the stop-band suppression in the first embodiment is high.

Figure 12:
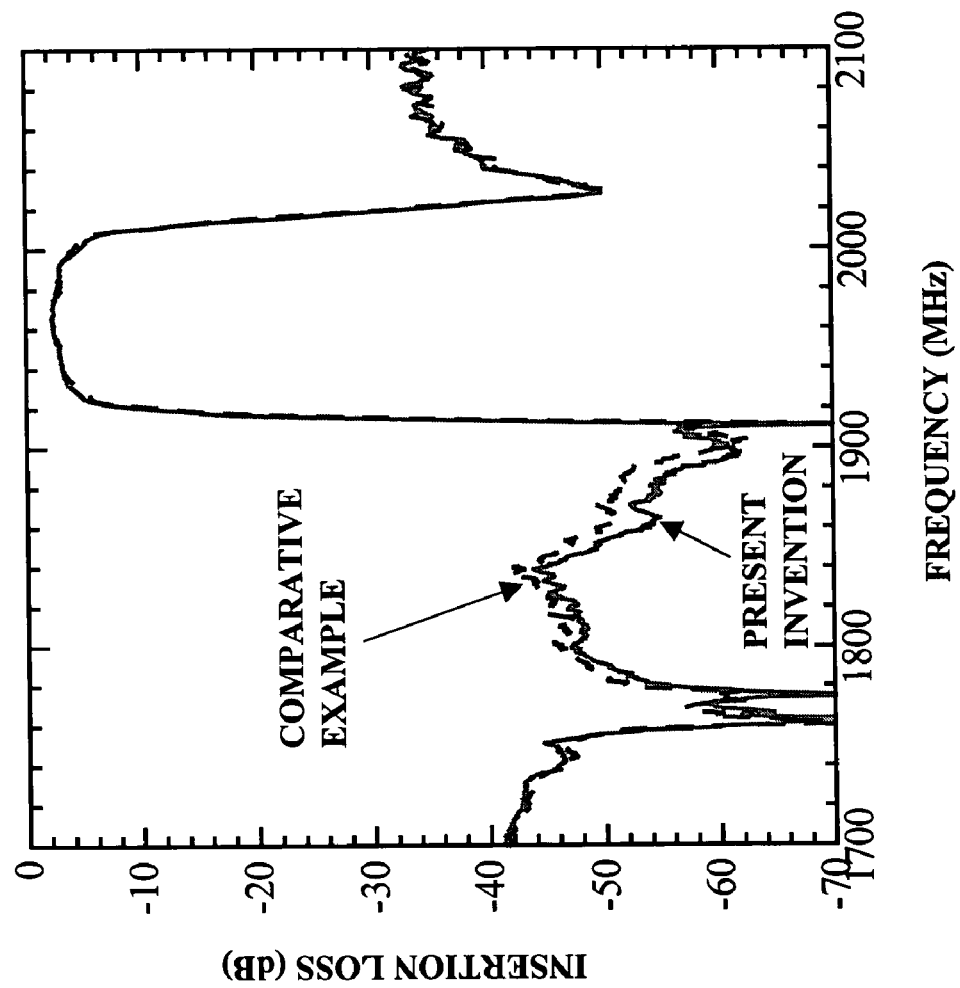
FIG. 12 is a graph showing the frequency characteristics of the reception filter in a case where a reception ground line pattern is provided for each of the grounds of the reception filter, and the reception ground line patterns are connected with a partition ground line pattern via ground foot pads.

In FIGS. 5A through 5E and FIG. 6, the reception ground line patterns 142 and 152 are connected or integrated to the grounds of the reception filter 113, and are connected to each other with the partition ground line pattern 160 via the ground foot pads 162 and 163. As indicated by the solid line in FIG. 12, the degree of the stop-band suppression of the reception filter 113 can be increased with this structure. The broken line in FIG. 12 indicates the characteristics of a comparative example in which the grounds of the reception filter 113 are connected in an inner layer of the laminated package 120.

Figure 13:
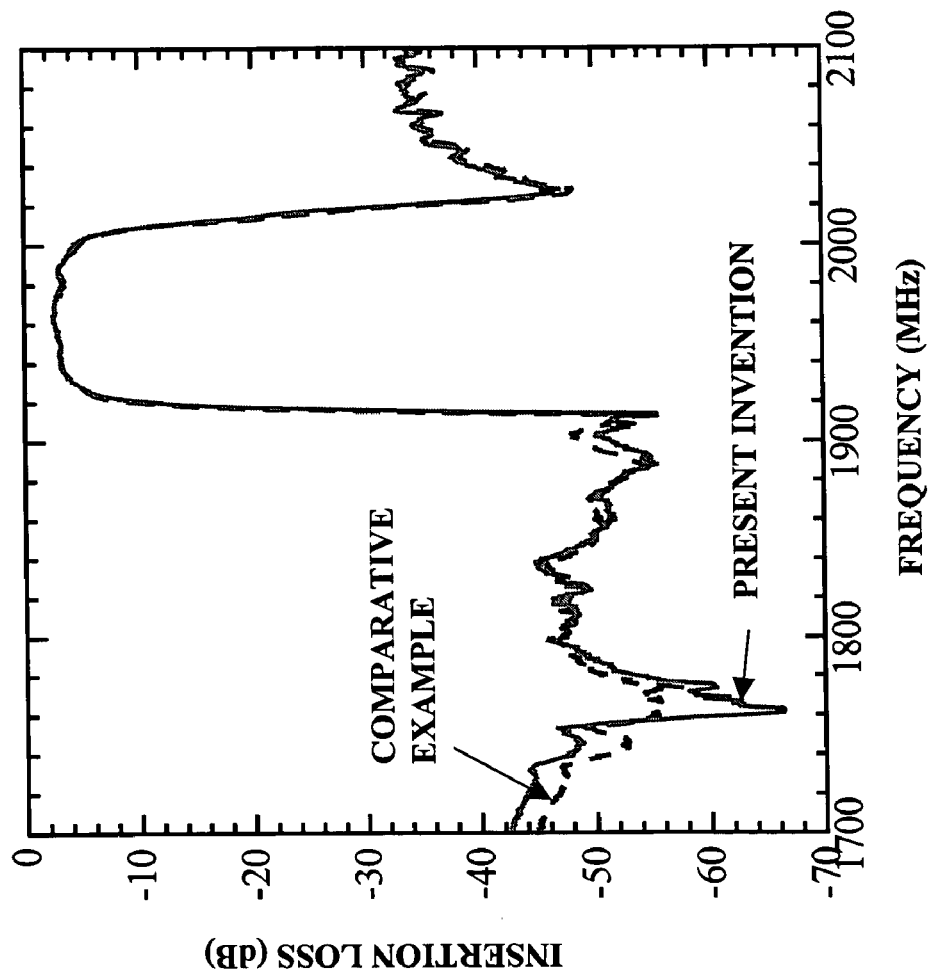
FIG. 13 is a graph showing the frequency characteristics of the reception filter in a case where the transmission ground line patterns and the reception ground line patterns are connected via ground foot pads.

As described above, the transmission ground line patterns 141 and 151 and the reception ground line patterns 142 and 152 are connected via the ground foot pads 161 through 163, so that the degree of stop-band suppression is increased as shown in FIG. 13. The broken line in FIG. 13 indicates the characteristics of a comparative example in which the transmission ground line patterns 141 and 151 and the reception ground line patterns 142 and 152 are not connected in the laminated package 120.

Figure 14:
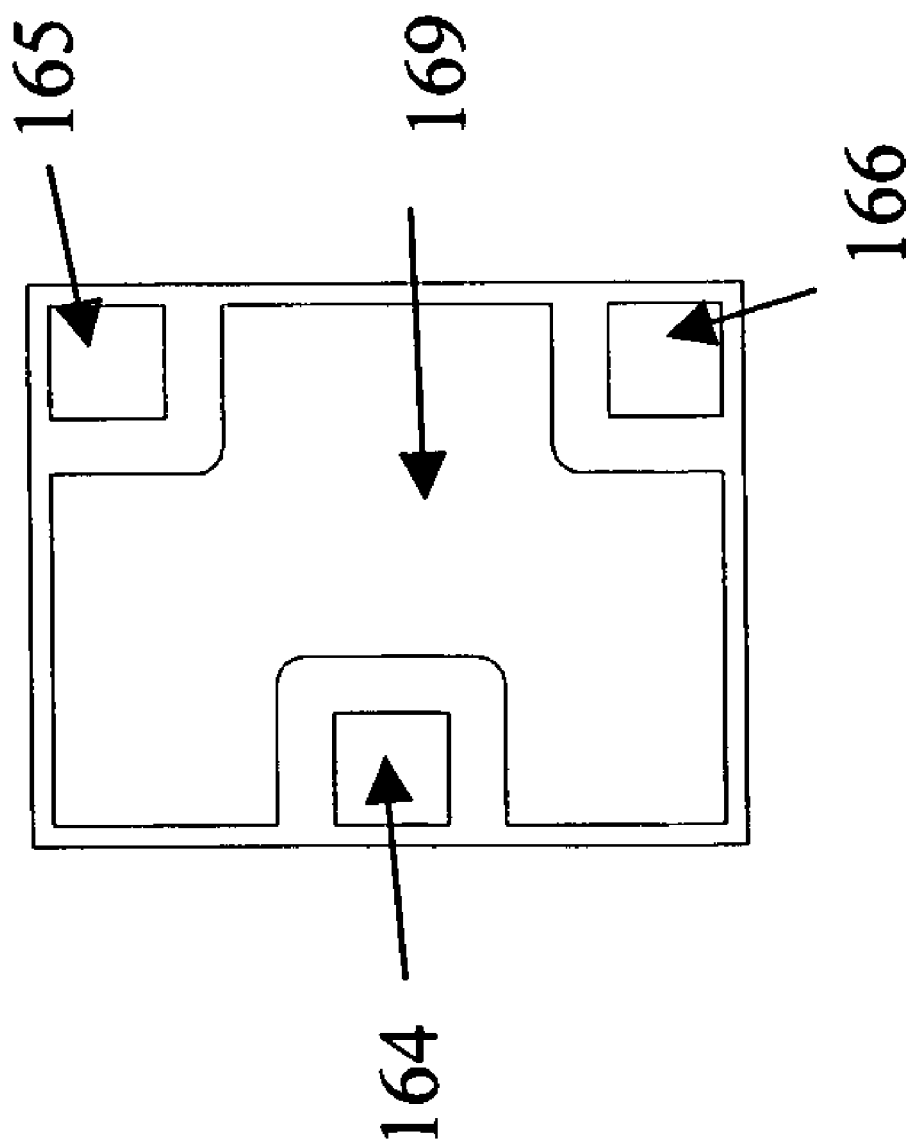
FIG. 14 shows a modification of the first embodiment.

The ground foot pads 161 through 163 may be connected as shown in FIG. 14. As a ground foot pad 169 covers most of the bottom face of the line pattern/foot pad layer 124, the adverse influence of external noise can be reduced. Furthermore, a higher degree of freedom can be allowed in positioning the via holes for electrically connecting the layers.

Figure 15:
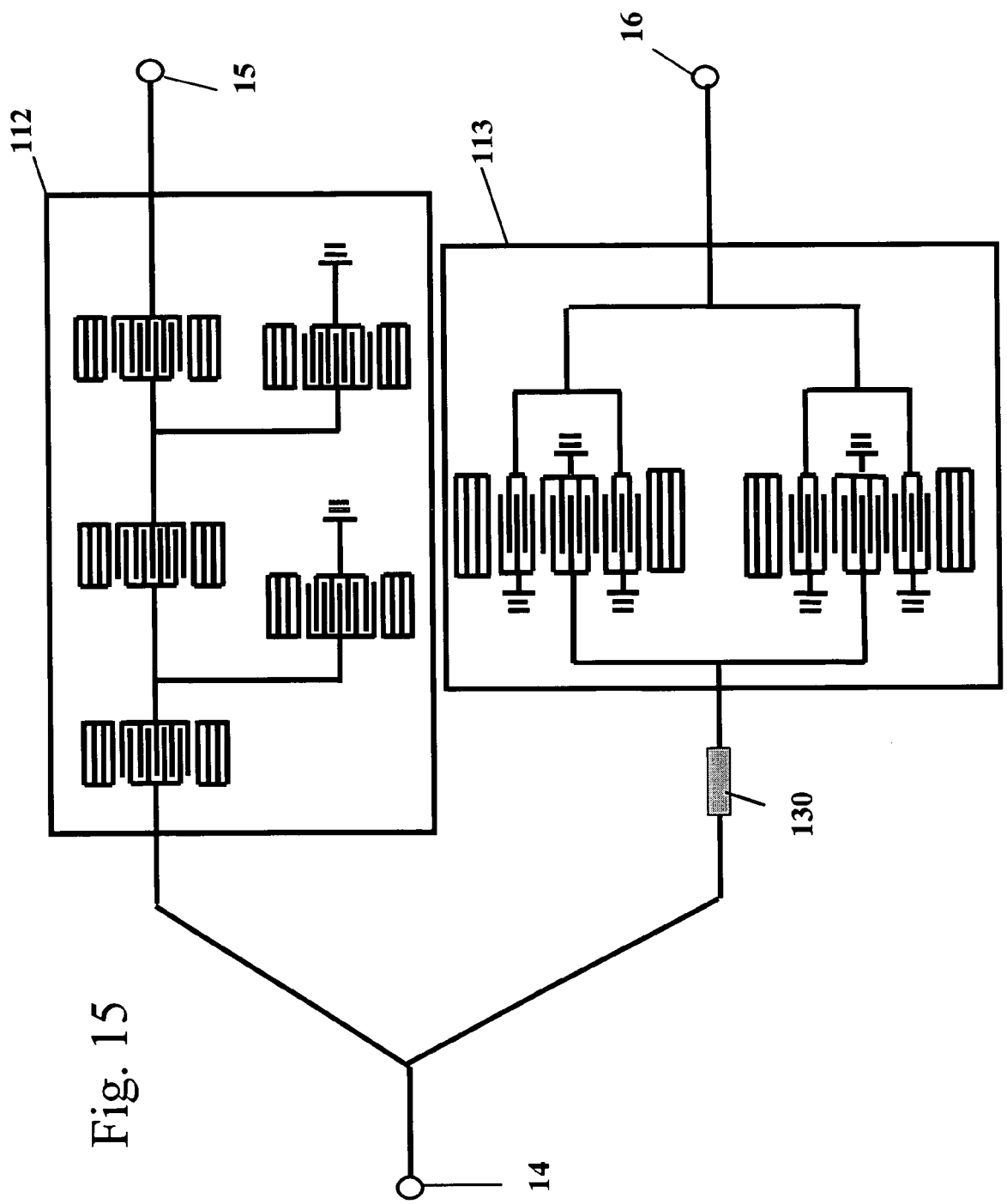
FIG. 15 is a circuit diagram of an example structure of the filter chip in accordance with the present invention.

In the following, examples of materials and sizes of the duplexer in accordance with the first embodiment are described. The laminated package 120 is made of alumina or glass ceramics with relative permittivity of approximately 9.5. The phase matching circuit 130 is a lumped-constant circuit that includes an inductor and a capacitor formed on an insulating substrate. The outside dimension of the laminated package 120 is approximately 2.5×2×0.6 mm. The package size of a conventional duplexer is approximately 5×5×1.5 mm or 3.8×3.8×1.5 mm. Compared with this, the duplexer of the present invention is much smaller. The filter chip may be a piezoelectric single-crystal substrate of 42° Y-cut X-propagation LiTaO$_3$, for example, and a ladder filter (the transmission filter 112) and a multi-mode filter (the reception filter 113) are formed on the piezoelectric single-crystal substrate. FIG. 15 illustrates an example of the filter chip. Although the multi-mode filter has a single-port configuration in the structure illustrated in FIG. 15, it may have a balanced output configuration.

Figure 16A:
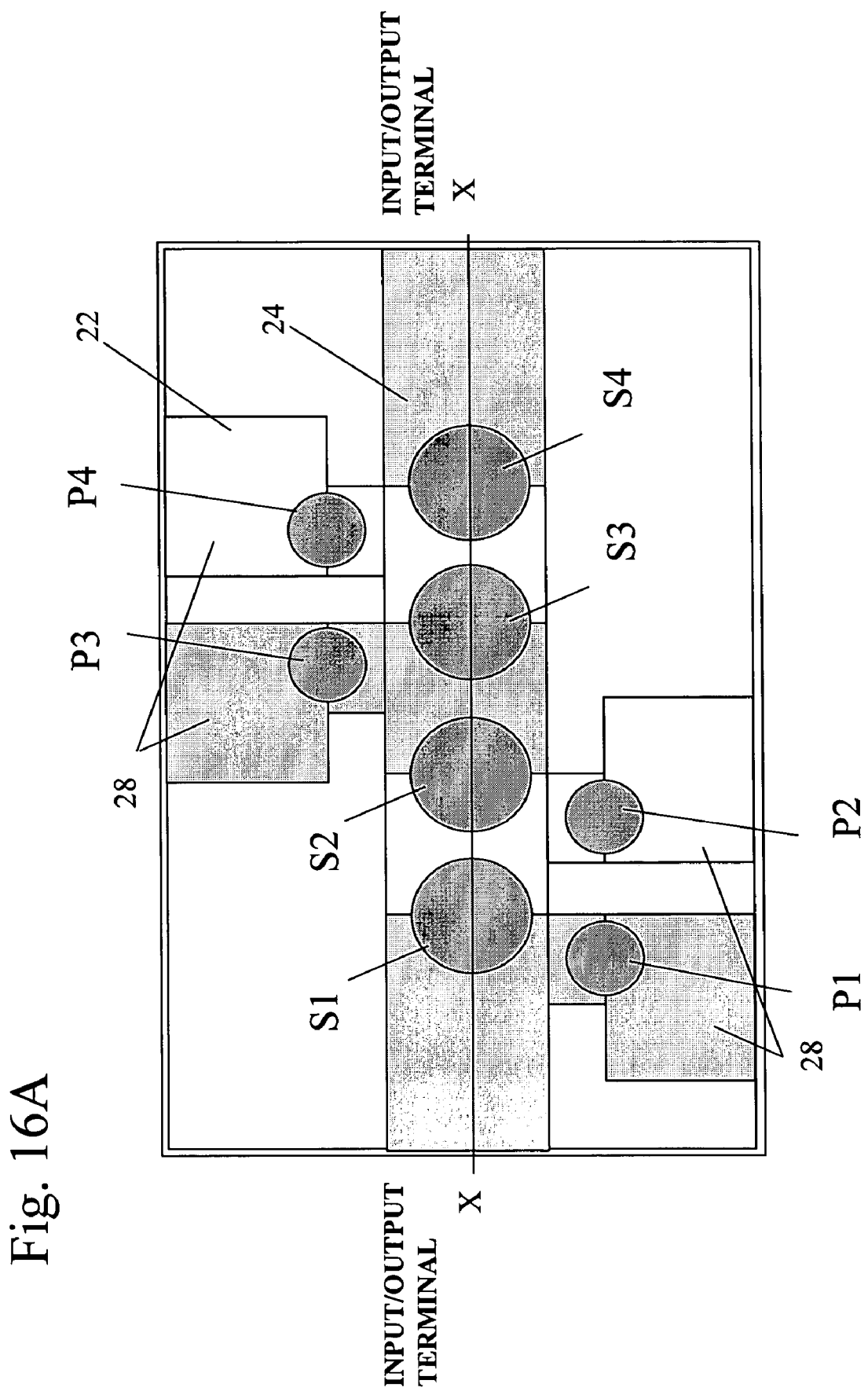
FIG. 16A is a circuit diagram of another example structure of the filter chip in accordance with the present invention.
Figure 16B:
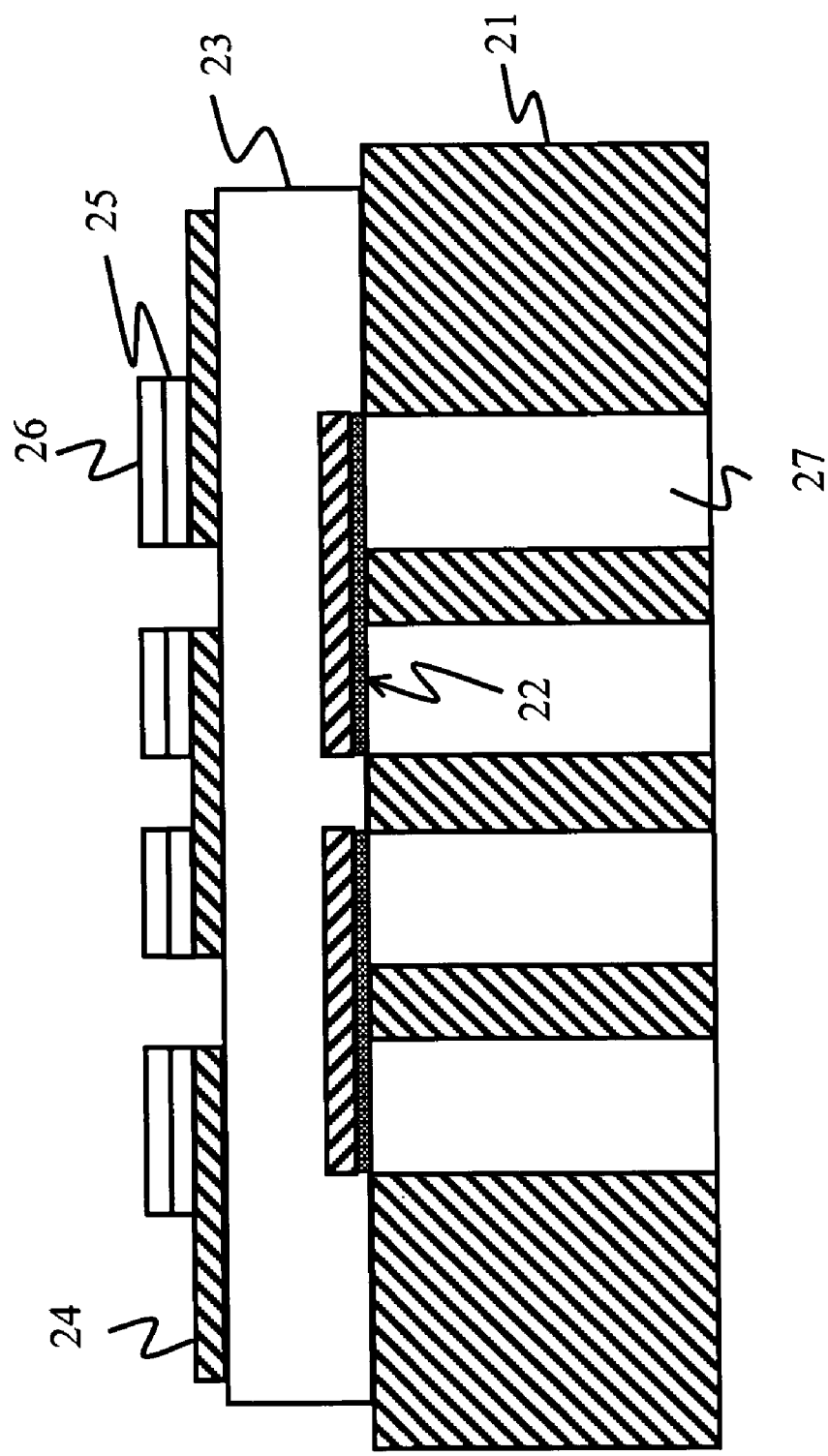
FIG. 16B is a cross-sectional view of the another example structure of the filter chip in accordance with the present invention.
Figure 17:
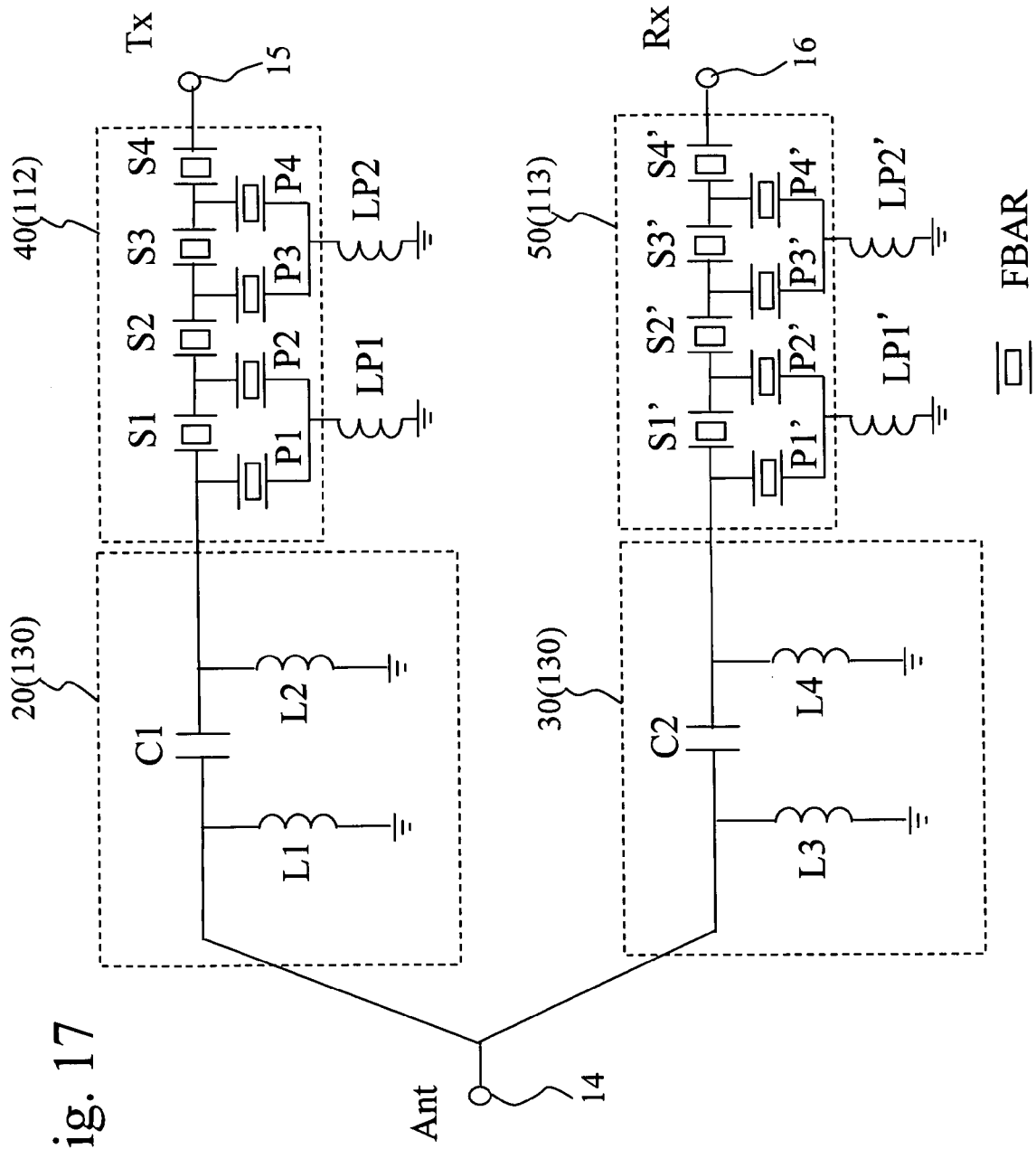
FIG. 17 is a circuit diagram of a duplexer that employs the filter chip illustrated in FIGS. 16A and 16B.

The transmission filter 112 and the reception filter 113 may also be piezoelectric thin-film resonators. FIGS. 16A and 16B illustrate an example of a filter (a FBAR filter) that is formed with piezoelectric thin-film resonators (FBAR). FIG. 17 shows an example circuit structure of a duplexer that employs the FBAR filter. FIG. 16A is a plan view of the FBAR filter, and FIG. 16B is a cross-sectional view of the FBAR filter, taken along the line X-X. The first BFBAR filter includes several FBARs. Each FBAR is a structure that has a laminated structure of an upper electrode film 24, a piezoelectric film 23, and a lower electrode film 22. In this structure, cavities 27 formed in a substrate 21 are located immediately below the lower electrode film 22 as opposed to the upper electrode film 24, thereby enclosing elastic energy. The lower electrode film 22 may have a two-layer structure, for example. The film that is exposed to the cavities 27 may be a Cr film, and the film that is disposed on the Cr film may be a Ru film, for example. Two adjusting layers 25 and 26 for adjusting the center frequency of the FBAR filter are formed on the upper electrode film 24. The FBAR filter includes four series-arm resonator S1 through S4 and four parallel-arm resonators P1 through P4. The parallel-arm resonators P1 through P4 are connected to ground patterns 28 formed on the piezoelectric film 23. The two ends of the upper electrode film 24 are used as input/output terminals.

Using two FBAR filters each having the above described structure, the duplexer illustrated in FIG. 17 is formed. The illustrated duplexer includes FBAR filters 40 and 50 that embody the transmission filter 112 and the reception filter 113, respectively. Phase matching circuits 20 and 30 are provided for the FBAR filters 40 and 50, respectively. An inductance LP1 is interposed between the ground and the parallel-arm resonators P1 and P2 of the FBAR filter 40, and an inductance LP2 is interposed between the ground and the parallel-arm resonators P3 and P4 of the FBAR filter 40. These inductances LP1 and LP2 are embodied by the above described transmission ground line patterns 141 and 151 and the reception ground line patterns 142 and 152. The FBAR filter 50 is formed in the same manner as the FBAR filter 40. The FBAR filter 50 includes four series-arm resonators S1' through S4', four parallel-arm resonators P1' through P4', and inductances LP1' and LP2'.

The duplexer with the above described structure in accordance with the present invention constantly exhibits high filter characteristics while maintaining high isolation between signals, despite the small device size.

Second Embodiment

Figure 18A:
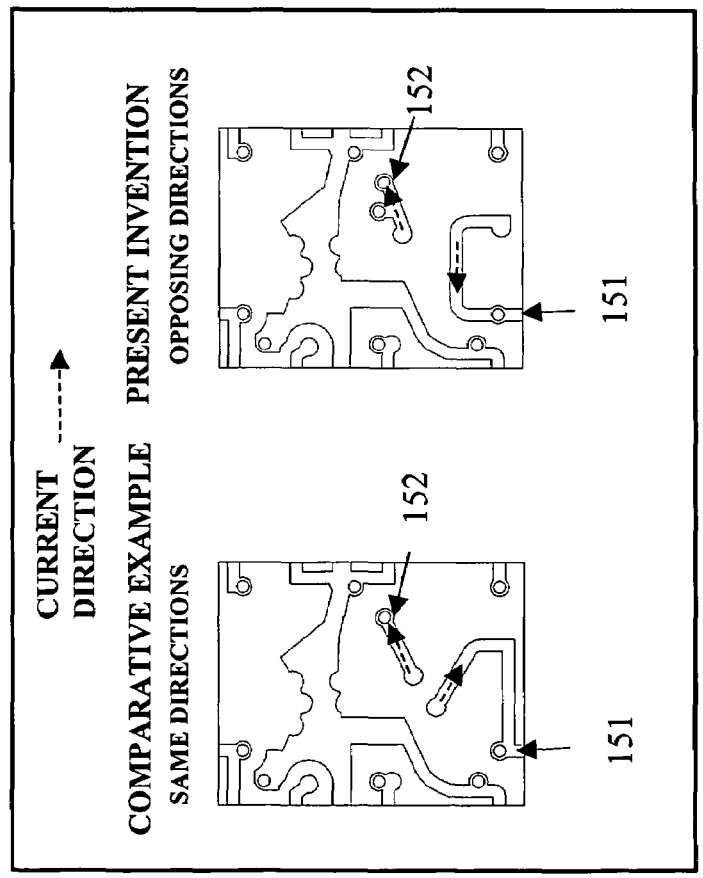
FIGS. 18A and 18B illustrate the components of a duplexer in accordance with a second embodiment of the present invention.
Figure 18B:
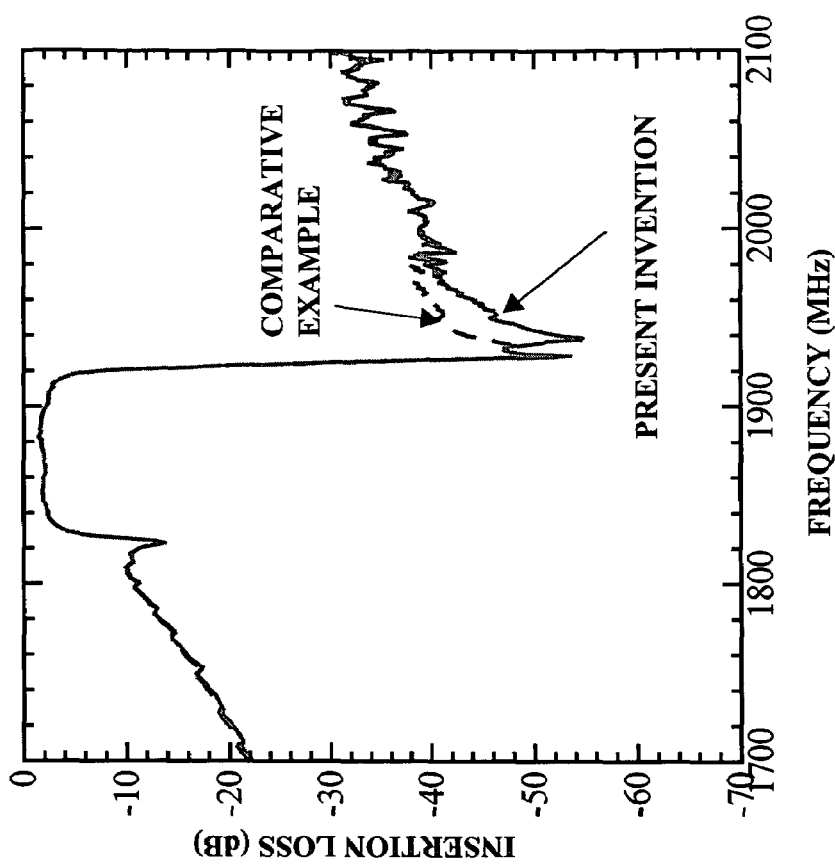

FIGS. 18A and 18B show a duplexer in accordance with a second embodiment of the present invention. In this embodiment, the direction of the ground current flowing through the transmission ground line pattern 151 is substantially opposite to the direction of the ground current flowing through the reception ground line pattern 152, as shown in FIG. 18A. Accordingly, the mutual inductance between the grounds can be reduced. FIG. 18B shows the filter characteristics of the second embodiment (indicated by the solid line), and the filter characteristics of a comparative example (indicated by the broken line). The comparative example has a structure in which the direction of the ground current flowing through the transmission ground line pattern 151 is substantially the same as the direction of the ground current flowing through the reception ground line pattern 152. As shown in FIG. 18B, the duplexer in accordance with the second embodiment has a higher degree of stop-band suppression.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A duplexer comprising:
a transmission filter and a reception filter that have different band center frequencies from each other;
a phase matching circuit that performs phase matching on the transmission filter and the reception filter; and
a laminated package that includes a first layer, a second layer, a first ground foot pad used for external connection, a second ground foot pad used for external connection, a transmission signal foot pad used for external connection and a reception signal foot pad used for external connection,
the transmission filter, the reception filter, and the phase matching circuit being mounted on the first layer;
the first layer comprising a first ground line pattern that is connected to a ground of the transmission filter, a second ground line pattern that is connected to a ground of the reception filter, a third ground line pattern that is connected to a ground of the phase matching circuit, a first transmission signal line pattern, and a first reception signal line pattern,
the second layer being located below the first layer, the second layer comprising a second transmission signal line pattern that is connected to the transmission filter via the first transmission signal line pattern and is connected to the transmission signal foot pad, a second reception signal line pattern that is connected to the reception filter via the first reception signal line pattern and is connected to the reception signal foot pad, and a partition ground line pattern that is located between the second transmission signal line pattern and the second reception signal line pattern in the same surface of the second layer,
the first ground line pattern being connected to the partition ground line pattern only via the first ground foot pad, and
the second ground line pattern being connected to the partition ground line pattern only via the second ground foot pad.

2. The duplexer as claimed in claim 1, wherein the first ground line pattern and the second ground line pattern are respectively connected to the ground foot pads so that the first and second ground line patterns are mutually connected via the partition ground line pattern only.

3. The duplexer as claimed in claim 1, wherein the first ground line pattern does not overlap with the second ground line pattern.

4. The duplexer as claimed in claim 1, wherein the transmission filter and the reception filter are formed on at least one chip, and are face-down mounted to the first layer.

5. The duplexer as claimed in claim 1, wherein the transmission filter and the reception filter are surface acoustic wave filters.

6. The duplexer as claimed in claim 1, wherein the transmission filter and the reception filter are piezoelectric thin-film filters.

\* \* \* \* \*